United States Patent
Yeo et al.

(10) Patent No.: US 7,172,943 B2
(45) Date of Patent: Feb. 6, 2007

(54) MULTIPLE-GATE TRANSISTORS FORMED ON BULK SUBSTRATES

(75) Inventors: Yee-Chia Yeo, Hsin-Chu (TW); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/669,395

(22) Filed: Sep. 24, 2003

(65) Prior Publication Data

US 2005/0035415 A1 Feb. 17, 2005

Related U.S. Application Data

(60) Provisional application No. 60/495,071, filed on Aug. 13, 2003.

(51) Int. Cl.
*H01L 21/336* (2006.01)
*H01L 21/00* (2006.01)
*H01L 29/76* (2006.01)

(52) U.S. Cl. ............... 438/300; 438/157; 438/283; 257/329; 257/331

(58) Field of Classification Search ............... 438/157, 438/283, 300; 257/329, 330, 331, 157
See application file for complete search history.

(56) References Cited

U.S. PATENT DOCUMENTS

| | | | |
|---|---|---|---|
| 5,893,741 A * | 4/1999 | Huang | 438/300 |
| 6,252,284 B1 | 6/2001 | Muller et al. | |
| 6,342,410 B1 * | 1/2002 | Yu | 438/164 |
| 6,391,695 B1 | 5/2002 | Yu | |
| 6,391,782 B1 | 5/2002 | Yu | |
| 6,413,802 B1 | 7/2002 | Hu et al. | |
| 6,432,829 B2 * | 8/2002 | Muller et al. | 438/694 |
| 6,451,656 B1 | 9/2002 | Yu et al. | |
| 6,475,890 B1 * | 11/2002 | Yu | 438/574 |
| 6,492,212 B1 | 12/2002 | Ieong et al. | |
| 6,525,403 B2 * | 2/2003 | Inaba et al. | 257/618 |
| 6,635,909 B2 * | 10/2003 | Clark et al. | 257/192 |
| 6,720,619 B1 * | 4/2004 | Chen et al. | 257/347 |
| 6,764,884 B1 * | 7/2004 | Yu et al. | 438/157 |

OTHER PUBLICATIONS

Huang, X., et al. "Sub-50 nm P-Channel FinFET," IEEE Transactions on Electron Devices, vol. 48, No. 5 (May 2001) pp. 880-886.
Yang, F.L., et al. "35nm CMOS FinFETs," 2002 Symposium on VLSI Technology Digest of Technical Papers, (Jun. 2002) pp. 109-110.

(Continued)

*Primary Examiner*—Douglas W. Owens
*Assistant Examiner*—Samuel A Gebremaraim
(74) *Attorney, Agent, or Firm*—Slater & Matsil, L.L.P.

(57) ABSTRACT

In one aspect, the present invention teaches a multiple-gate transistor 130 that includes a semiconductor fin 134 formed in a portion of a bulk semiconductor substrate 132. A gate dielectric 144 overlies a portion of the semiconductor fin 134 and a gate electrode 146 overlies the gate dielectric 144. A source region 138 and a drain region 140 are formed in the semiconductor fin 134 oppositely adjacent the gate electrode 144. In the preferred embodiment, the bottom surface 150 of the gate electrode 146 is lower than either the source-substrate junction 154 or the drain-substrate junction 152.

36 Claims, 6 Drawing Sheets

OTHER PUBLICATIONS

Wong, H.-S.P. "Beyond the Conventional Transistor," IBM Journal of Research and Development (Mar./May 2002) pp. 133-167.

Chau, R., et al. "Advanced Depleted-Substrate Transistors: Single-gate, Double-gate and Tri-gate," Extended Abstracts of the 2002 International Conference on Solid State Devices and Materials, (2002) pp. 68-69.

Yang, F.L., et al. "25nm CMOS Omega FETs," International Electron Devices Meeting, Digest of Technical Papers, (Dec. 2002) pp. 255-258.

Colinge, J.P., et al. "Silicon-on-Insulator "Gate -All-Around Device"," International Electron Devices Meeting, (1990) pp. 595-598.

Leobandung, E. "Wire-Channel and wrap-around-gate metal-oxide-semiconductor field-effect transistors with a significant reduction of short channel effects," Journal of Vacuum Science and Technology, vol. B15, No. 6, (Nov./Dec. 1997) pp. 2791-2794.

* cited by examiner

MULTIPLE-GATE TRANSISTORS FORMED ON BULK SUBSTRATES

This application claims the benefit of U.S. Provisional Application No. 60/495,071, filed on Aug. 13, 2003, entitled "Multiple-Gate Transistors Formed on Bulk Substrates," which application is hereby incorporated herein by reference.

TECHNICAL FIELD

The present invention relates to semiconductor devices and more particularly to the multiple-gate transistors formed on bulk semiconductor substrates.

BACKGROUND

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed performance, circuit density, and cost per unit function over the past few decades. As the gate length of the conventional bulk MOSFET is reduced, however, the source and drain increasingly interact with the channel and gain influence on the channel potential. Consequently, a transistor with a short gate length suffers from problems related to the inability of the gate to substantially control the on and off states of the channel.

Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-50 nm regime, the requirements for body-doping concentration, gate oxide thickness, and source/drain (S/D) doping profiles become increasingly difficult to meet when conventional device structures based on bulk silicon (Si) substrates are employed.

Figure 1:
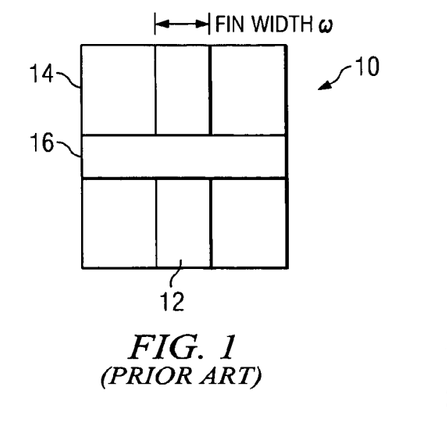
FIG. 1 is a plan view illustrating the multiple-gate transistor of the prior art.
Figure 2A:
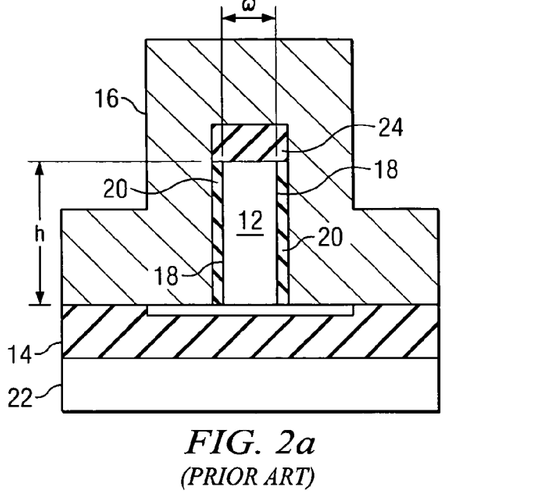
FIG. 2a is a cross-sectional view of the double-gate transistor of the prior art.

For device scaling well into the sub-30-nm regime, a promising approach to controlling short-channel effects is to use an alternative transistor structure with more than one gate, i.e. a multiple-gate transistor. Prior art multiple-gate transistors are formed on silicon-on-insulator substrates. A prior art multiple-gate transistor 10 is shown in plan view in FIG. 1. The structure includes a silicon fin 12 overlying an insulator layer 14, which overlies a substrate (see element 22 in FIG. 2). A gate dielectric (see element 20 in FIG. 2) covers a portion of the silicon fin 12, and a gate electrode 16 straddles across the silicon fin 12. The gate dielectric 20 isolates the gate electrode 16 from the silicon fin 12.

Examples of the multiple-gate transistor include the double-gate transistor, triple-gate transistor, omega field-effect transistor (FET), and the surround-gate or wrap-around gate transistor. A multiple-gate transistor structure is expected to extend the scalability of CMOS technology beyond the limitations of the conventional bulk MOSFET and realize the ultimate limit of silicon MOSFETs. The introduction of additional gates improves the capacitance coupling between the gates and the channel, increases the control of the channel potential by the gate, helps suppress short channel effects, and prolongs the scalability of the MOS transistor.

The simplest example of a multiple-gate transistor is the double-gate transistor as described in U.S. Pat. No. 6,413,802 issued to Hu et al. As illustrated in the cross-sectional view of FIG. 2a, the double-gate transistor has a gate electrode 16 that straddles across the channel or the fin-like silicon body 12, thus forming a double-gate structure. There are two gates, one on each sidewall 18 of the silicon fin 12. The plan view of the double-gate structure is shown in FIG. 1.

In U.S. Pat. No. 6,413,802, the transistor channel comprises a thin silicon fin 12 defined using an etchant mask 24 and formed on an insulator layer 14, e.g. silicon oxide. Gate oxidation is performed, followed by gate deposition and gate patterning to form a double-gate structure overlying the sides of the fin. Both the source-to-drain direction and the gate-to-gate direction are in the plane of the substrate surface.

Figure 2B:
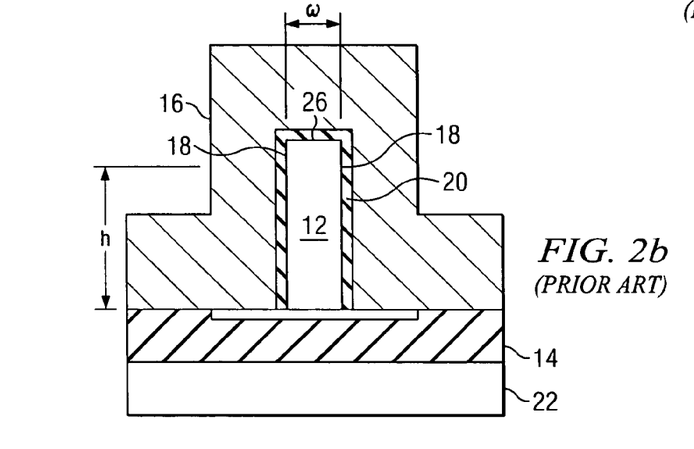
FIG. 2b is a cross-sectional view of the triple-gate transistor of the prior art.

Another example of the multiple-gate transistor is the triple-gate transistor. A cross-sectional view of a triple-gate transistor structure is provided in FIG. 2b. The plan view of the triple-gate structure is shown in FIG. 1. The triple-gate transistor structure has a gate electrode 16 that forms three gates: one gate on the top surface 26 of the silicon body/fin 12, and two gates on the sidewalls 18 of the silicon body/fin 12. The triple-gate transistor achieves better gate control than the double-gate transistor because of it has one more gate on the top of the silicon fin.

Figure 2C:
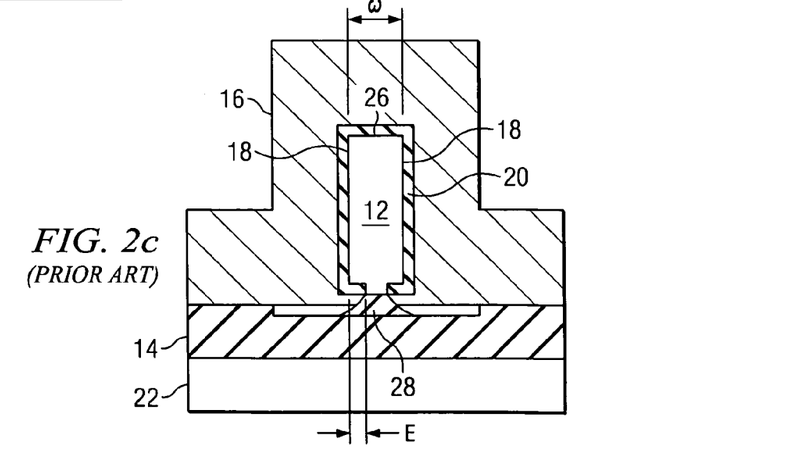
FIG. 2c is a modified structure of the triple-gate transistor shown in FIG. 2b.

The triple-gate transistor structure may be modified for improved gate control, as illustrated in FIG. 2c. Such a structure is also known as the Omega ($\Omega$) field-effect transistor (FET), or simply omega-FET, since the gate electrode 16 has an omega-shape in its cross-sectional view. The encroachment of the gate electrode 16 under the semiconductor fin or body 12 forms an omega-shaped gate structure. It closely resembles the Gate-All-Around (GAA) transistor for excellent scalability, and uses a very manufacturable process similar to that of the double-gate or triple-gate transistor.

The omega-FET has a top gate (adjacent surface 26), two sidewall gates (adjacent surfaces 18), and special gate extensions or encroachments 28 under the fin-like semiconductor body 12. The omega-FET is therefore a field effect transistor with a gate that almost wraps around the body. In fact, the longer the gate extension, i.e., the greater the extent of the encroachment E, the more the structure approaches or resembles the gate-all-around structure. The encroachment of the gate electrode 16 under the silicon body helps to shield the channel from electric field lines from the drain and improves gate-to-channel controllability, thus alleviating the drain-induced barrier lowering effect and improving short-channel performance.

SUMMARY OF THE INVENTION

The preferred embodiment of the present invention provides a multiple-gate transistor that is formed on a bulk substrate. Bulk silicon substrates are cheaper than silicon-on-insulator substrates. Therefore, the availability of a technology that forms multiple-gate transistors on bulk substrates will enable future device scaling at a significantly reduced cost.

In accordance with a preferred embodiment of the preferred embodiment, a structure and method for the fabrication of multiple-gate transistors on bulk substrates includes depletion-mode bulk multiple-gate transistors and accumulation mode bulk multiple-gate transistors, bulk double-gate transistor, bulk triple-gate transistor, and bulk omega-gate transistor and multiple-gate transistors formed on bulk substrates may be integrated with conventional bulk transistors.

Prior art multiple-gate transistors such as the double-gate transistor, the triple-gate transistor, and the omega-FET are formed on silicon-on-insulator substrates. This patent teaches a structure and method for forming multiple-gate transistors on bulk substrate. Many of the multiple-gate transistors taught here achieve low cost of manufacture and enable scalability of bulk transistors to significantly reduced feature sizes.

In one aspect, the present invention teaches a multiple-gate transistor that includes a semiconductor fin formed in a portion of a bulk semiconductor substrate. A gate dielectric overlies a portion of the semiconductor fin and a gate electrode overlies the gate dielectric. A source region and a drain region are formed in the semiconductor fin oppositely adjacent to the gate electrode. In the preferred embodiment, the bottom surface of the gate electrode is lower than either the source-substrate junction or the drain-substrate junction.

In one method of forming a multiple-gate transistor according to a preferred embodiment, a bulk semiconductor substrate is provided. A semiconductor fin is formed on the bulk semiconductor substrate and isolation regions are provided on sides of the semiconductor fin. A gate dielectric and a gate electrode are formed on a portion of the semiconductor fin. A source region and a drain region are formed in the semiconductor fin. Once again, in the preferred embodiment the source-substrate junction or drain-substrate junction is higher than the bottom surface of the gate electrode.

In another embodiment of the present invention, portions of a silicon substrate are etched to form at least one semiconductor fin. A gate dielectric layer is formed over the semiconductor fin and a gate electrode layer is formed over the gate dielectric layer. Portions of the gate electrode layer are etched to form a gate electrode so that the gate electrode overlies sidewalls and a top surface of the semiconductor fin. A region of material, e.g., dielectric, is formed adjacent portions of the semiconductor fin not underlying the gate electrode such that a sidewall of the semiconductor fin extends above an upper surface of the region of material. The sidewall of the semiconductor fin above the region of material can then be doped.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiment relates to the field of semiconductor devices and more particularly to semiconductor devices with multiple gates. Aspects of this invention provide a structure and method for forming multiple-gate transistors on bulk silicon substrates.

Figure 3:
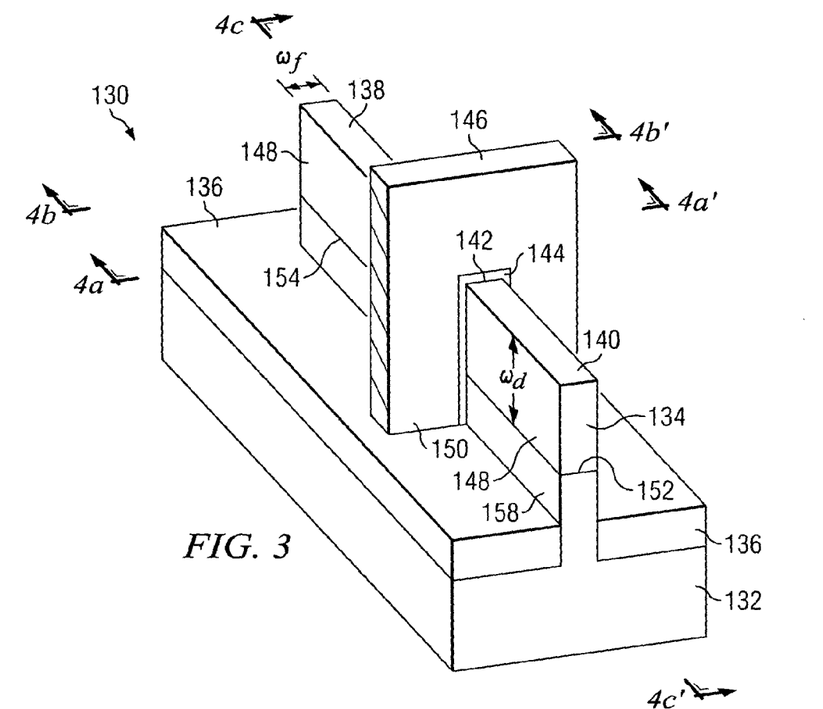
FIG. 3 is a three-dimensional view of a triple-gate transistor embodiment of the present invention.

FIG. 3 shows a three-dimensional perspective of a triple-gate transistor 130 formed on a bulk substrate 132 according to a first embodiment of this invention. The substrate 132 material can be any semiconductor material. For example, the substrate 132 can be an elemental semiconductor such as silicon or germanium, an alloy semiconductor such as silicon-germanium, or a compound semiconductor such as gallium arsenide. In the preferred embodiment, the substrate 132 comprises monocrystalline silicon.

The bulk triple-gate transistor 130 includes a semiconductor fin 134 formed on the bulk substrate 132. Isolation regions 136 are formed between semiconductor fins (one fin 134 as shown), or between a semiconductor fin 134 and another active region (not shown). The isolation region 136 may comprise silicon oxide, silicon oxynitride, silicon nitride, or combinations thereof. Mesa isolation can also be used.

The semiconductor fin 134 includes a doped source region 138 and a doped drain region 140. The source and drain regions 138 and 140 sandwich a channel region 142. A gate dielectric 144 overlies the channel portion 142 of the semiconductor fin 134, as shown in FIG. 3. In fact, the gate dielectric 144 insulates the semiconductor fin 134 from the gate electrode 146.

The gate electrode 146 straddles across fin-like active region 134. The sidewall surfaces 148 of the semiconductor fin 134 are used for current conduction. In the preferred embodiment, a significant amount of source-to-drain current in the transistor is carried along the sidewall surfaces 148. The semiconductor fin 134 has a predetermined fin width $w_f$ and a drain that has a depth $w_d$ from the top surface of the semiconductor fin. Essentially, the effective device width of the transistor is a function of $w_d$ and $w_f$. A larger $w_d$ or $w_f$ would result in a larger amount of drive current.

Figure 4A:
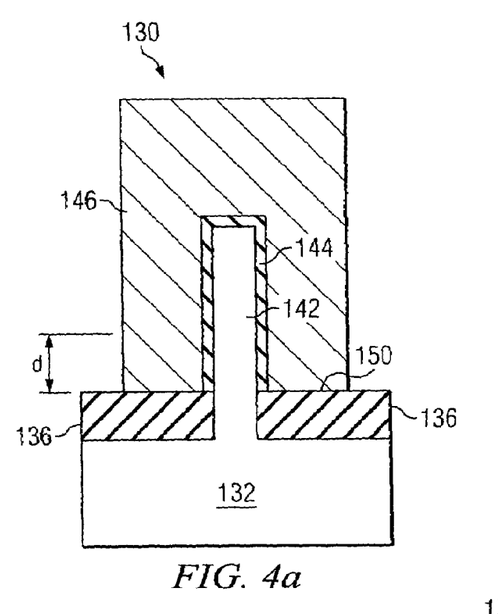
FIGS. 4a–4c provide cross-sectional views of the triple-gate transistor of FIG. 3.
Figure 4B:
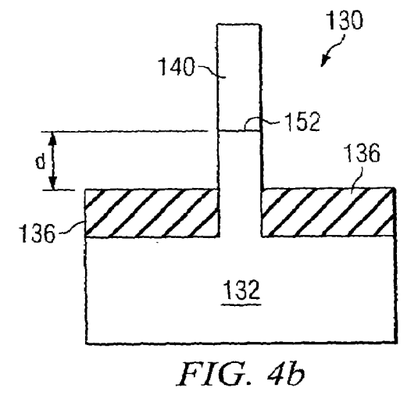
Figure 4C:
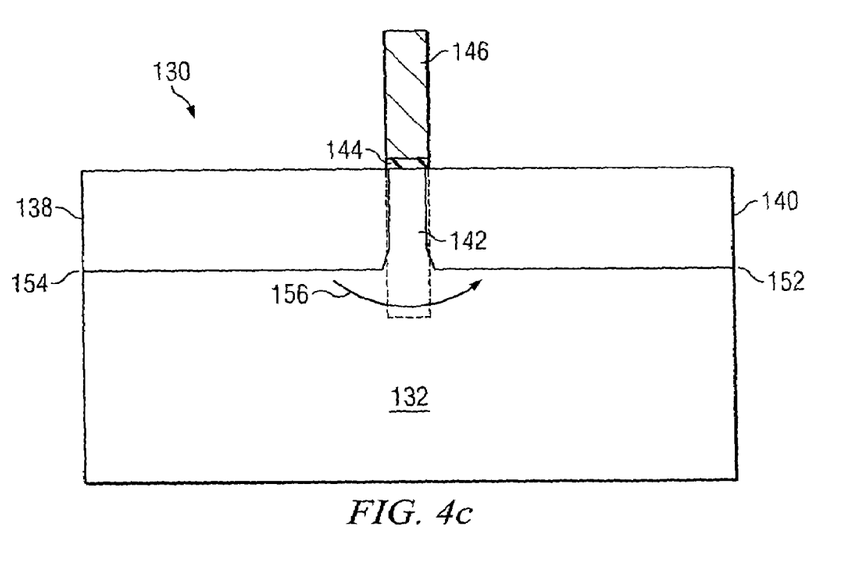

Cross-sectional views of the triple-gate transistor of FIG. 3 in the planes of 4a–4a', 4b–4b', and 4c–4c' are illustrated in FIGS. 4a, 4b, and 4c, respectively. FIG. 4a shows cross-sectional view in the plane that cuts through the gate electrode 146, the gate dielectric 144, and the channel region 142 of semiconductor fin 134. The gate electrode 146 has a bottom surface 150 that touches the isolation region 136.

A cross-sectional view in the plane of 4b–4b', which is parallel to plane 4a–4a', is shown in FIG. 4b. The view cuts through the drain region 140 of the transistor 130. One feature of the design is that the bottom surface 150 of the gate electrode 146 is below the level of the drain-substrate junction 152 or the level of the source-substrate junction 154.

Referring now to FIGS. 4a and 4b, the drain-substrate junction 152 depicted in FIG. 4b is at a level that is higher than the level of the bottom surface 150 of the gate electrode 146 depicted in FIG. 4a. The difference d in the heights of the drain-substrate junction 152 and the bottom surface 150 of the gate electrode 146 may be in the range of about 50 angstroms to about 500 angstroms, and preferably about 200 angstroms.

FIG. 4c shows a cross-sectional view in the plane that cuts through the gate electrode 146, the gate dielectric 144, the channel region 142, the source region 138, and the drain region 140. FIG. 4c also shows a potential leakage current path 156 between the source and the drain regions 138 and 140. The gate electrode 146 above or below the plane of the page (i.e., plane 4c–4c') is drawn in dashed lines in FIG. 4c, showing that the gate electrode 146 is in the vicinity of the potential leakage current path. Therefore, by having the gate electrode 146 extend below the source-substrate junction 154 or the drain-substrate junction 152, and positioning the gate electrode 146 in the vicinity of the potential leakage path 156, this embodiment ensures that the gate electrode 146 exerts considerable influence on the potential leakage path 156 to suppress the leakage.

In various aspects of this invention, the source and drain regions 138 and 140 may be doped n-type, and the body region 142 may be doped p-type to form an n-channel depletion-mode transistor, or the source and drain regions 138 and 140 may be doped p-type, and the body region 142 doped n-type to form a p-channel depletion-mode transistor. Alternatively, accumulation mode transistors may be formed by having the body regions 142 doped the same type as the source and drain regions 138 and 140. For example, the source 138, drain 140, and body 142 may all be doped n-type to form an n-channel accumulation mode transistor.

Figure 5A:
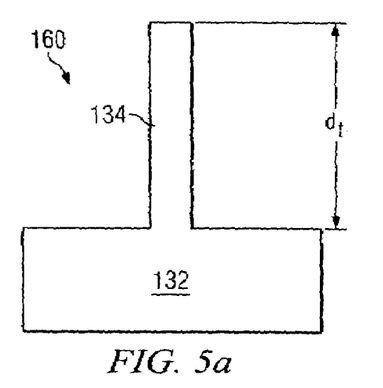
FIGS. 5a–5e and 6a–6e illustrate the fabrication of a triple-gate transistor of the present invention.

A method of forming the multiple-gate transistor of FIG. 3 will now be described with reference to FIGS. 5a–5e (collectively FIG. 5) and FIGS. 6a–6e (collectively FIG. 6). FIGS. 5 and 6 show the device cross-section in two parallel planes at the various stages of device fabrication. In particular, FIG. 5 shows the device 130 in the plane 4a–4a' of FIG. 3 and FIG. 6 shows the device 130 in the plane 4b–4b' of FIG. 3. As before, the planes 4a–4a' and 4b–4b' are parallel to each other. A perspective view of a transistor after additional steps are performed is shown in FIG. 7.

The starting material is a semiconductor substrate 132 that may be an elemental semiconductor, an alloy semiconductor, or a compound semiconductor. The starting material is preferably a silicon substrate, preferably about 300 mm in diameter. At least one semiconductor fin 134 is formed by patterning the semiconductor substrate, as shown in FIGS. 5a and 6a. The semiconductor fin patterning process may be accomplished by forming a mask (not shown) over the semiconductor 132, followed by the etching of the semiconductor 132 to a predetermined depth $d_t$. The mask may comprise a commonly used mask material such as photoresist or silicon oxide or silicon nitride, combinations thereof. The trench depth $d_t$ may be in the range of about 200 angstroms to about 6000 angstroms, preferably about 3000 angstroms.

The trench depth $d_t$ may be the same for all semiconductor fins 134 formed in substrate 132. Alternatively, trenches of different depths can be formed on the same bulk semiconductor substrate 132. This embodiment allows for transistors with different drive currents to be formed on the same chip. This embodiment can be realized by selectively removing portions of the trench mask (not shown) during the etching process so that some trenches are etched for longer.

Figure 8:
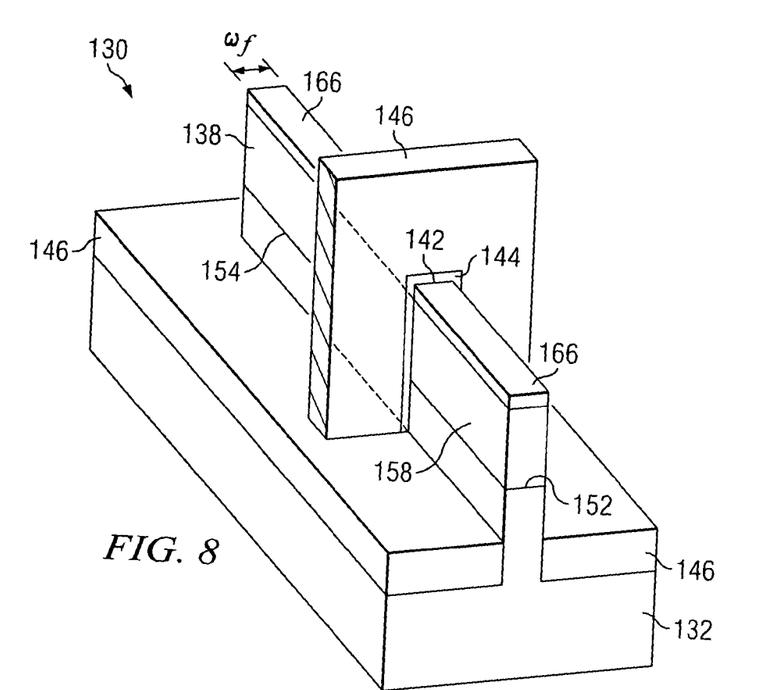
FIG. 8 is a perspective view of a double-gate transistor of the present invention.

The mask may or may not be removed after the etching step. If it is removed, as in the preferred embodiment, a triple-gate transistor will be formed. If it is not removed, a double-gate transistor, as illustrated in FIG. 8, can be formed.

Figure 5B:
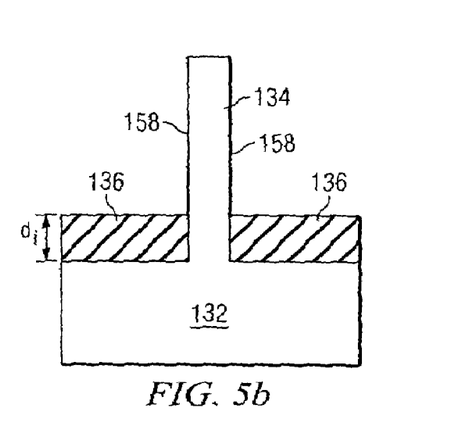
Figure 6A:
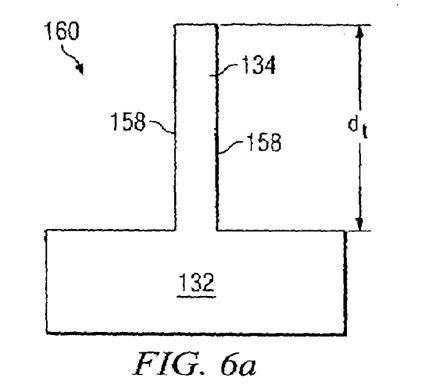
Figure 6B:
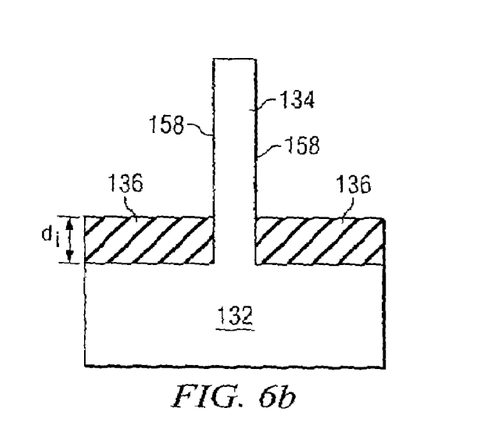
Figure 6C:
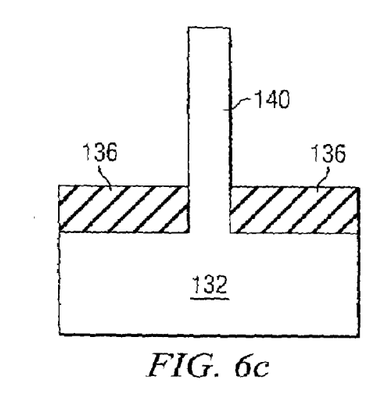
Figure 7:
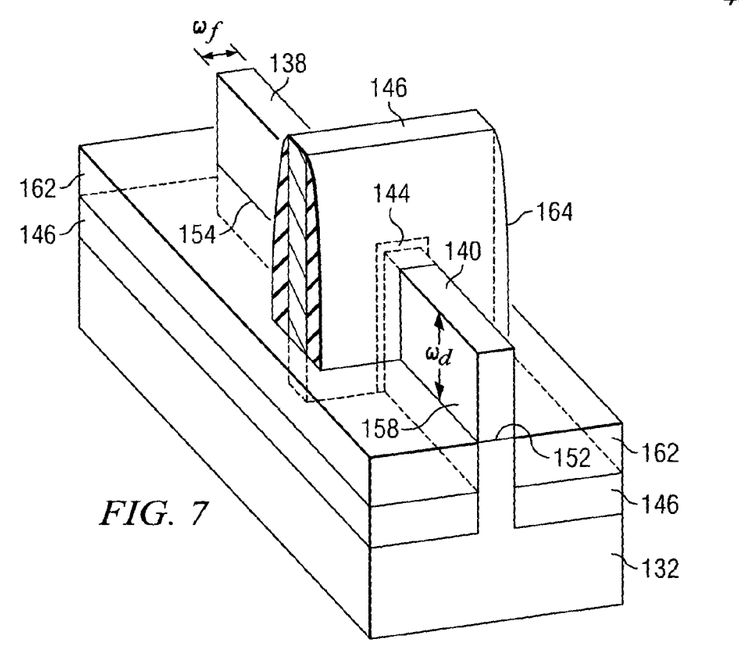
FIG. 7 is a perspective view of another embodiment triple-gate transistor of the present invention.

Referring now to FIGS. 5b and 6b, isolation regions 136 with a depth of $d_i$ are formed in the trench 160. The isolation depth $d_i$ may be in the range of about 20 angstroms to about 6000 angstroms, preferably about 200 angstroms. In the preferred embodiment, the ratio of $d_t$:$d_i$ ranges from about 1.2:1 to about 6:1, preferably about 2:1. The semiconductor fin has sidewall surfaces 158 as shown.

Figure 5C:
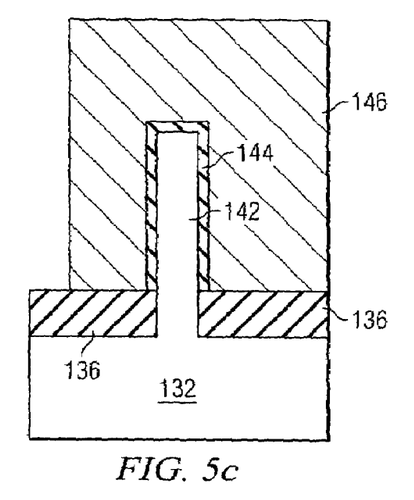

A gate dielectric layer 144 is then formed on the semiconductor fin 134. Due to subsequent processing, the gate dielectric 144 is shown in FIG. 5c but not in FIG. 6c. The gate dielectric may be formed by thermal oxidation, chemical vapor deposition, sputtering, or any other methods known and used in the art for forming a gate dielectric. Depending on the technique of gate dielectric formation, the gate dielectric 144 thickness on the top of the fin 134 may be different from the gate dielectric thickness on the fin sidewall. In one embodiment, the gate dielectric thickness on the top surface of the fin is less than about 20 angstroms.

The gate dielectric may be formed from a material such as silicon dioxide or silicon oxynitride with a thickness ranging from about 3 angstroms to about 100 angstroms, preferably about 10 angstroms or less. The gate dielectric may also formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 3 angstroms to about 100 angstroms.

Next, the gate electrode 146 material is deposited. The gate electrode material is a conductive material and may be amorphous or polycrystalline silicon (poly-Si), poly-crystalline silicon-germanium (poly-SiGe), a metallic nitride, a metallic silicide, a metallic oxide, or a metal. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, and others.

The gate electrode 146 material may be deposited by chemical vapor deposition (CVD), by sputter deposition, or by other techniques known and used in the art for depositing conductive materials. The thickness of the gate electrode material may be in the range of about 200 angstroms to about 4000 angstroms, preferably about 1500 angstroms. The top surface of the gate electrode 146 material usually has a non-planar top surface, and may be planarized (e.g., chemical-mechanical polished) prior to patterning of the gate electrode 146 material or gate etch. Ions may or may not be introduced into the gate electrode 146 material at this point. Ions may be introduced, for example, by ion implantation techniques.

The next step is the definition of the gate electrode 146. A mask material (not shown) is formed on the gate electrode material, and the gate electrode 146 is formed by an etching process, preferably an anisotropic etch (e.g., dry plasma etching process), to give the cross-sections in FIGS. 5c and 6c. In this example, gate dielectric 144 has also been patterned, although this step is not necessary.

Figure 5D:
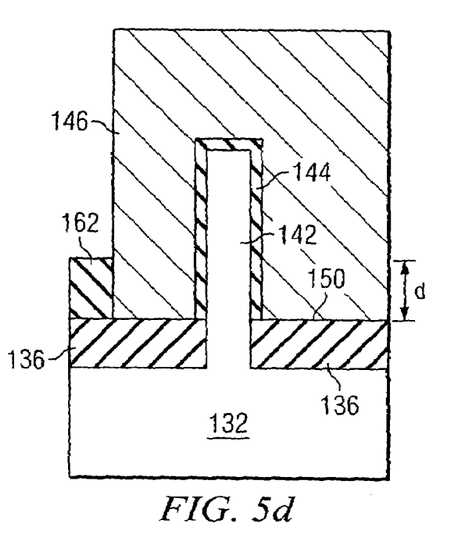
Figure 6D:
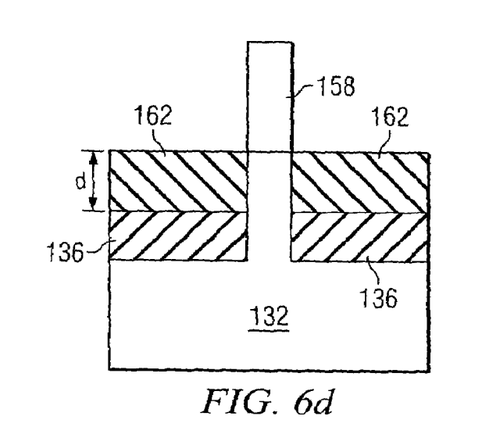

A dielectric layer 162 is then formed to cover a portion of the sidewall surface 158 of the semiconductor fin 134, not already covered by isolation region 136. Referring now to FIGS. 5d and 6d, the layer 162 is formed such that a sidewall 158 semiconductor fin 134 extends above the upper surface of layer 162. This dielectric layer 162 allows the formation of the source and drain regions 138 and 140 such that the drain-substrate junction 152 or the source-substrate junction 154 is at a higher level than the bottom surface 150 of the gate electrode 146. In the preferred embodiment, the drain-substrate junction 152 or the source-substrate junction 154 is defined to be the position where the doping concentration in the source or drain region 138 is at the $10^{18}$ cm$^{-3}$ level. In the preferred embodiment, dielectric layer 162 comprises silicon oxide.

In the preferred embodiment, the material region 162 is formed to a thickness between about 50 angstroms and about 500 angstroms, preferably about 200 angstroms. The height of the exposed portion of sidewall 158 is typically in the range of about 500 angstroms to about 2000 angstroms, preferably about 1000 angstroms. As a result, the ratio of the thickness of the material region 162 to the height of the exposed portion of the sidewall 158 is preferably between about 1:1 to about 1:20.

Figure 5E:
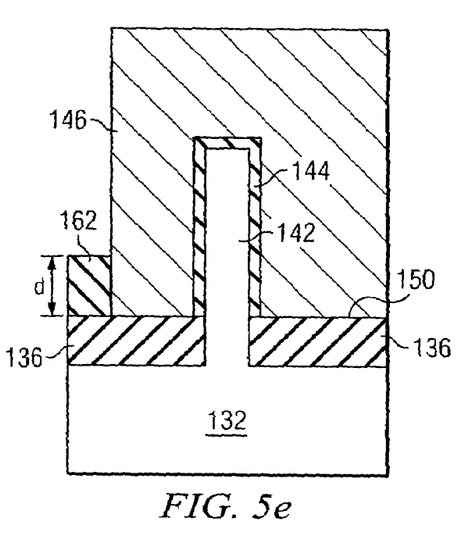
Figure 6E:
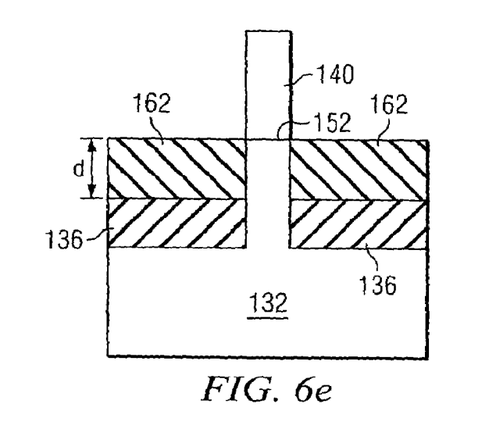

The source and drain regions 138 and 140 are formed next as shown in FIGS. 5e and 6e. The formation of the source and drain regions 138 and 140 may involve several steps. In the preferred embodiment, an ion implantation process is first performed to dope the source and drain regions 138 and 140 immediately adjacent to the channel region 142. The channel region 142 is the portion of the semiconductor fin 134 wrapped around by the gate dielectric 144 and the gate electrode 146.

Spacers (164 in FIG. 7) are then formed on the sidewalls of the gate electrode 146. The spacers 164 may be formed by deposition of a spacer material(s) followed by anisotropic etching of the spacer material(s) to form the spacers 164. The spacer is formed from a dielectric material, preferably silicon nitride (e.g., $Si_3N_4$). The spacer material may also be formed from a stack of dielectric materials, such as a silicon nitride layer overlying a silicon oxide layer. FIG. 7 shows a three-dimensional perspective of the transistor structure with spacers 164 and the dielectric layer 162.

A selective epitaxy may additionally be performed to increase the width and/or height of the fin 134 in the source and drain regions 138 and 140. The selective epitaxy results in epitaxial growth in the source and drain regions 138 and 140, and perhaps the gate electrode region 146. The epitaxy can be performed uniformly for all fins 134 on a single substrate 132 or can be performed to different levels (including none) for different fins on a single substrate.

An optional ion implantation is then performed to dope the source and drain regions 138 and 140. The ion implantation process is performed if the selective epitaxy does not incorporate dopants into the grown regions during epitaxial growth. Conductive materials (not shown) such as suicides may be formed on the source and drain regions (138 and 140) to increase the conductance in these regions.

FIG. 8 shows a structure for a double gate transistor. This device is similar to the triple gate device of FIG. 7 but also includes an etch mask 166, as was discussed above. In the preferred embodiment, the etch mask 166 is formed of silicon oxynitride and has a thickness between about 20 angstroms and about 500 angstroms.

Figure 9:
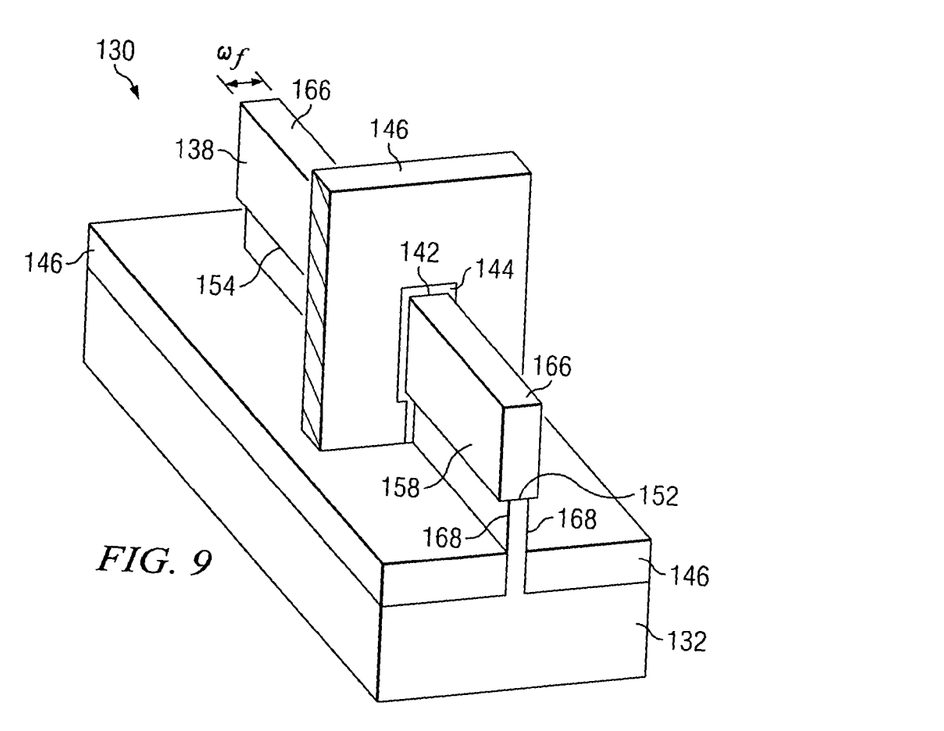
FIG. 9 is a perspective view of an omega-gate transistor of the present invention.

A transistor with an omega-shaped gate electrode, as shown in FIG. 9, can also be formed by slightly modifying the fabrication process just described. For example, during the definition of the semiconductor fin in FIGS. 5a and 6a, a two-step etch may be employed. A first etch step may employ a highly anisotropic plasma etch process with a negligible lateral etch rate. A second etch step may employ a less anisotropic etch so that some lateral etch takes place, resulting in a narrower semiconductor fin at the base. The two-step etch will result in a semiconductor fin with a wider fin width at the top, e.g., source 138 and drain 140, and a narrower fin width at the bottom 168. The remaining fabrication steps follow those as described above. The resulting transistor structure is shown in FIG. 9.

The following references are related to aspects of the preferred embodiment and are hereby incorporated herein by reference:

[1] C. Hu et al., University of California, FinFET transistor structures having a double gate channel extending vertically from a substrate and methods of manufacture, U.S. Pat. No. 6,413,802.

[2] K. P. L. Muller et al., International Business Machines Corporation, Jun. 26 2001, Planarized Si fin device, U.S. Pat. No. 6,252,284.

[3] K. P. L. Muller et al., International Business Machines Corporation, Aug. 13 2002, Process for making planarized silicon fin device, U.S. Pat. No. 6,432,829.

[4] B. Yu, Advanced Micro Devices, Inc., May 21 2002, Double-gate transistor formed in a thermal process, U.S. Pat. No. 6,391,695.

[5] B. Yu, Advanced Micro Devices, Inc., May 21 2002, Process for forming multiple active lines and gate-all-around MOSFET, U.S. Pat. No. 6,391,782.

[6] B. Yu et al., Advanced Micro Devices, Inc., Sep. 17 2002, CMOS inverter configured from double gate MOSFET and method of fabricating same, U.S. Pat. No. 6,451,656.

[7] M. Ieong et al., International Business Machines Corporation, Dec. 10, 2002, Variable threshold voltage double gated transistors and method of fabrication, U.S. Pat. No. 6,492,212.

[8] X. Huang et al., "Sub-50 nm p-channel finFET," *IEEE Trans. Electron Devices*, vol. 48, no. 5, pp. 880–886, May 2001.

[9] F.-L. Yang et al., "35 nm CMOS FinFETs," *Symposium on VLSI Technology, Digest of Technical Papers*, pp. 109–110, June 2002.

[10] H.-S. P. Wong, "Beyond the conventional transistor," *IBM J. Research and Development*, vol. 46, no. 2/3, pp. 133–168, March/May 2002.

[11] R. Chau et al., "Advanced depleted-substrate transistors: single-gate, double-gate, and tri-gate", 2002 International Conference on Solid State Devices and Materials, Nagoya, Japan, pp. 68–69, September 2002.

[12] F.-L. Yang et al., "25 nm CMOS Omega-FETs," *International Electron Device Meeting*, Dig. Technical Papers, December 2002.

[13] J. P. Colinge et al., "Silicon-on-insulator gate-all-around device," *International Electron Device Meeting*, Dig. Technical Papers, pp. 595–598, December 1990.

[14] E. Leobandung et al., "Wire-channel and wrap-around-gate metal-oxide-semiconductor field-effect transistors with a significant reduction of short channel effects," *J. Vacuum Science and Technology B*, vol. 15, no. 6, pp. 2791–2794, 1997.

While several embodiments of the invention, together with modifications thereof, have been described in detail herein and illustrated in the accompanying drawings, it will be evident that various modifications are possible without departing from the scope of the preferred embodiment. The examples given are intended to be illustrative rather than exclusive. The drawings may not necessarily be to scale and features may be shown in a schematic form.

What is claimed is:

1. A method of forming a multiple-gate transistor, the method comprising:
   providing a bulk semiconductor substrate;
   forming a semiconductor fin, in the bulk semiconductor substrate;
   forming isolation regions on sides of the semiconductor fin;
   forming a gate dielectric and a gate electrode on a portion of the semiconductor fin, the gate electrode having a bottom surface;
   after forming the gate electrode, forming a masking layer over the isolation region and covering a lower portion of the semiconductor fin; and
   forming a source region and a drain region in uncovered portions of the semiconductor fin, using the masking layer as a mask, the source region having a source-substrate junction and the drain region having a drain-substrate junction, the source-substrate junction or drain-substrate junction being higher than the bottom surface of the gate electrode by an amount based on a thickness of the masking layer.

2. The method of claim 1 wherein the source-substrate junction and the drain-substrate junction is higher than the bottom surface of the gate electrode by a distance of between about 50 angstroms and about 500 angstroms.

3. The method of claim 1 wherein forming a semiconductor fin comprises:
   forming a mask over the bulk semiconductor substrate; and
   etching exposed regions of the semiconductor substrate to form the semiconductor fin.

4. The method of claim 3 further comprising removing the mask.

5. The method of claim 4 wherein the mask comprises a photoresist.

6. The method of claim 4 wherein the mask comprises a material selected from the group consisting of silicon oxide, silicon oxynitride, silicon nitride, and combinations thereof.

7. The method of claim 1 and further comprising strapping the source and drain regions with a conductive material.

8. The method of claim 1 and further comprising forming spacers on sides of the gate electrode.

9. The method of claim 1 and further comprising performing selective epitaxy on the source and drain regions.

10. The method of claim. 1 wherein the semiconductor fin comprises silicon.

11. The method of claim 1 wherein the semiconductor tin comprises silicon and germanium.

12. The method of claim 1 wherein the gate dielectric comprises silicon oxide or silicon oxynitride or silicon nitride.

13. The method of claim 1 wherein the gate dielectric comprises a high permittivity material.

14. The method of claim 1 wherein the gate dielectric comprises a material selected from the group consisting of lanthanum oxide, aluminum oxide, hafnium oxide, hafnium oxynitride, and zirconium oxide, and combinations thereof.

15. The method of claim 1 wherein the gate dielectric comprises a material with a relative permittivity greater than about 5.

16. The method of claim 1 wherein the gate dielectric has a thickness of between about 3 and about 100 angstroms.

17. The method of claim 1 wherein the gate electrode comprises polycrystalline or amorphous silicon.

18. The method of claim 1 wherein the gate electrode comprises poly-SiGe.

19. The method of claim 1 wherein the gate electrode comprises a metallic nitride.

20. The method of claim 1 wherein the gate electrode comprises a metallic suicide.

21. The method of claim 1 wherein the gate electrode comprises a metal.

22. The method of claim 1 wherein the multiple-gate transistor is a triple-gate transistor.

23. The method of claim 1 wherein the multiple-gate transistor is a double-gate transistor.

24. The method of claim 1 wherein the multiple-gate transistor is an omega-gate transistor.

25. The method of claim 1, wherein the source-substrate junction or drain-substrate junction being higher than the bottom surface of the gate electrode by at least about 28 angstrorns.

26. A method of forming a semiconductor device, the method comprising:
   providing a silicon substrate;
   etching portions of the silicon substrate to form at least one semiconductor fin;
   forming a gate dielectric layer over the semiconductor fin;
   forming a gate electrode layer over the gate dielectric layer;
   etching portions of the gate electrode layer to form a gate electrode, the gate electrode overlying sidewalls and a top surface of the semiconductor fin;
   after etching portions of the gate electrode layer, forming a region of material adjacent portions of the semiconductor fin not underlying the gate electrode such that a sidewall of the semiconductor fin extends above an upper surface of the region of material; and
   after forming the region of material, doping the sidewall of the semiconductor fin above the region of material.

27. The method of claim 26 and further comprising forming an isolation region adjacent the semiconductor fin, the isolation region being formed after etching portions of the silicon substrate but before forming the gate dielectric layer.

28. The method of claim 26 and further comprising forming a masking material over the silicon substrate and wherein the step of etching portions of the silicon substrate is performed in alignment with the masking material.

29. The method of claim 28 and further comprising removing the masking material after the semiconductor fin is formed.

30. The method of claim 28 wherein the gate dielectric layer and the gate electrode layer are formed over the masking material.

31. The method of claim 26 wherein forming a region of material comprises depositing a dielectric layer.

32. The method of claim 26 wherein forming a gate dielectric layer comprises forming a layer of a material with a relative permittivity greater than about 5.

33. The method of claim 26 and further comprising forming an isolation region adjacent the semiconductor fin.

34. The method of claim 26 and further comprising removing the region of material after doping the sidewall.

35. The method of claim 27 wherein forming an isolation region comprises depositing an oxide material.

36. The method of claim 26, wherein doping the sidewall comprises doping the sidewall in alignment with the region of material.

* * * * *

UNITED STATES PATENT AND TRADEMARK OFFICE
CERTIFICATE OF CORRECTION

PATENT NO. : 7,172,943 B2 Page 1 of 1
APPLICATION NO. : 10/669395
DATED : February 6, 2007
INVENTOR(S) : Yeo et al.

It is certified that error appears in the above-identified patent and that said Letters Patent is hereby corrected as shown below:

Column 10, line 4; delete "suicide" insert --silicide--
Column 10, line 15; delete "28" insert --50--
Column 10, line 16; delete "angstrorns" insert --angstroms--

Signed and Sealed this

Seventeenth Day of April, 2007

JON W. DUDAS
*Director of the United States Patent and Trademark Office*